(12) United States Patent
Wang et al.

(10) Patent No.: US 8,531,205 B1
(45) Date of Patent: Sep. 10, 2013

(54) PROGRAMMABLE OUTPUT BUFFER

(75) Inventors: Bonnie I. Wang, Cupertino, CA (US);
Chiakang Sung, Milpitas, CA (US);
Xiaobao Wang, Cupertino, CA (US);
Khai Nguyen, San Jose, CA (US);
Joseph Huang, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/363,108

(22) Filed: Jan. 31, 2012

(51) Int. Cl.
*H03K 17/16* (2006.01)

(52) U.S. Cl.
USPC ............ 326/30; 326/83; 326/86; 326/26; 327/108

(58) Field of Classification Search
USPC .......... 326/26, 30, 34, 21, 81–83, 86–87; 327/108–109, 333
See application file for complete search history.

(56) References Cited

U.S. PATENT DOCUMENTS

| | | | |
|---|---|---|---|
| 5,959,472 A | 9/1999 | Nagamatsu et al. | |
| 6,437,599 B1 | 8/2002 | Groen | |
| 6,452,428 B1 * | 9/2002 | Mooney et al. | 327/108 |
| 6,567,318 B2 * | 5/2003 | Bedarida et al. | 365/189.05 |
| 6,836,142 B2 * | 12/2004 | Lesea et al. | 326/30 |
| 6,927,608 B1 | 8/2005 | Chen et al. | |
| 7,038,502 B2 | 5/2006 | Yamaguchi | |
| 7,093,041 B2 * | 8/2006 | Gasparik | 710/100 |
| 7,196,556 B1 | 3/2007 | Nguyen et al. | |
| 7,443,193 B1 * | 10/2008 | Santurkar et al. | 326/30 |
| 7,538,588 B2 | 5/2009 | Liu et al. | |
| 7,898,295 B1 | 3/2011 | Kasturirangan et al. | |
| 2005/0046441 A1 * | 3/2005 | Braceras et al. | 326/30 |
| 2005/0093579 A1 | 5/2005 | Yamaguchi | |
| 2007/0127518 A1 | 6/2007 | Liu et al. | |
| 2011/0133772 A1 | 6/2011 | Shau | |
| 2011/0133780 A1 | 6/2011 | Shau | |

\* cited by examiner

*Primary Examiner* — Shawki Ismail
*Assistant Examiner* — Christopher Lo
(74) *Attorney, Agent, or Firm* — Okamoto & Benedicto LLP

(57) ABSTRACT

One embodiment relates to a programmable output buffer which includes first and second programmable variable-impedance single-ended driver circuits and first and second termination circuits. The first termination circuit is coupled to a first output pin which is driven by the first programmable variable-impedance single-ended driver circuit, and the second termination circuit is coupled to a second output pin which is driven by the second programmable variable-impedance single-ended driver circuit. The first and second termination circuits are programmable to either provide parallel termination for a differential signal or drive single-ended signals with the parallel termination turned off. Other embodiments and features are also disclosed.

8 Claims, 8 Drawing Sheets

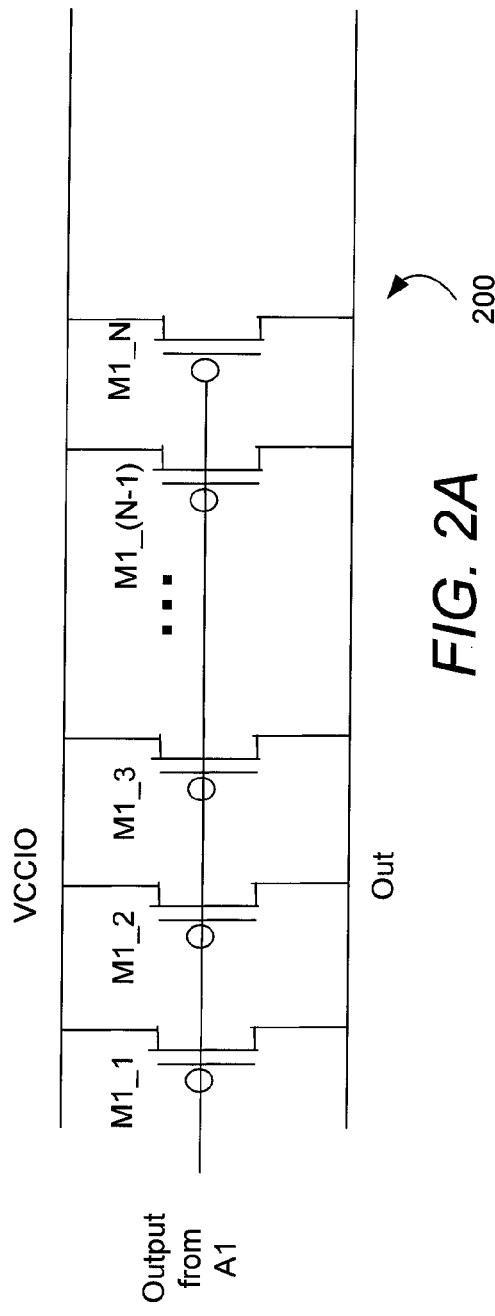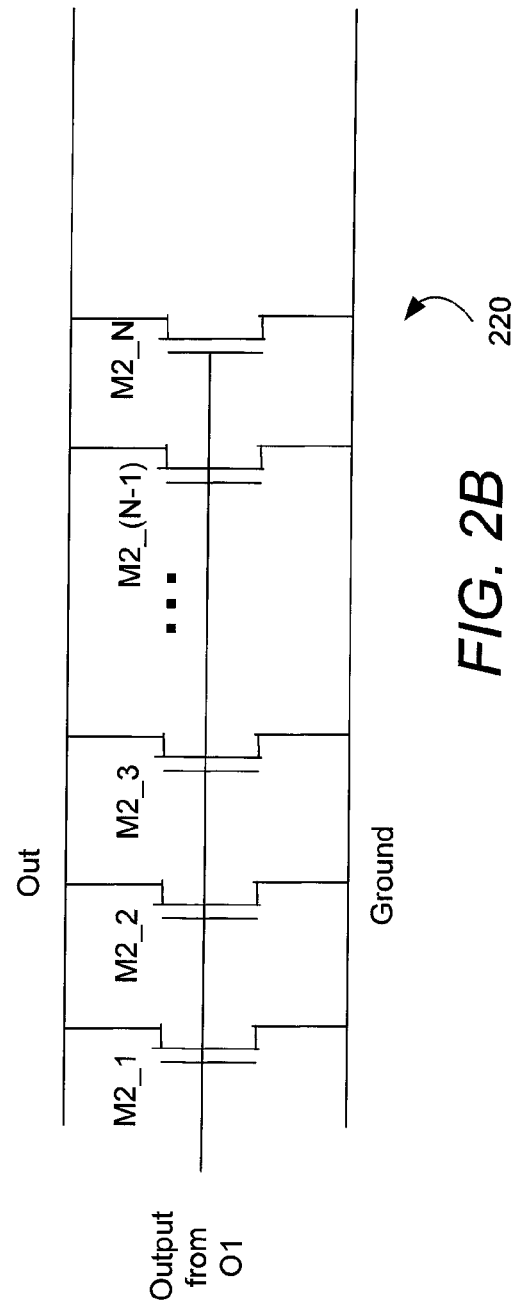
FIG. 2A
FIG. 2B

US 8,531,205 B1

PROGRAMMABLE OUTPUT BUFFER

BACKGROUND

1. Technical Field

The present invention relates generally to data communications. More particularly, the present invention relates to a differential output buffer.

2. Description of the Background Art

High-speed serial data links are used to communicate data between devices in a system. Low Voltage Differential Signaling (LVDS) and other differential signaling technologies are used in many high-speed communication protocols.

The programmable nature of field programmable gate arrays (FPGAs) and other programmable logic devices (PLDs) generally requires that each input/output (I/O) pin is capable of supporting a large variety of I/O protocols. However, supporting each I/O protocol with its own dedicated output driver circuit increases the device cost and leads to undesirably large pin capacitance.

SUMMARY

One embodiment relates to a programmable output buffer which includes first and second programmable variable-impedance single-ended driver circuits and first and second termination circuits. The first termination circuit is coupled to a first output pin which is driven by the first programmable variable-impedance single-ended driver circuit, and the second termination circuit is coupled to a second output pin which is driven by the second programmable variable-impedance single-ended driver circuit. The first and second termination circuits are programmable to either provide parallel termination for a differential signal or drive single-ended signals with the parallel termination turned off.

Another embodiment relates to an integrated circuit including at least a first data output pin, a second data output pin, first and second variable-impedance single-ended driver circuits, and first and second variable-impedance pull-up and pull-down transistor circuits. The first variable-impedance single-ended driver circuit is arranged to receive a first data input signal and output a first data output signal on the first output pin, and the second variable-impedance single-ended driver circuit is arranged to receive a second data input signal and output a second data output signal on the second output pin. The first variable-impedance pull-up transistor circuit is arranged to interconnect a voltage source to the first output pin, and the first variable-impedance pull-down transistor circuit is arranged to interconnect a circuit ground to the first output pin. The second variable-impedance pull-up transistor circuit is arranged to interconnect the voltage source to the second output pin, and the second variable-impedance pull-down transistor circuit is arranged to interconnect the circuit ground to the second output pin.

Another embodiment relates to a method for using a programmable output buffer on an integrated circuit. An output impedance of first and second on-chip single-ended drivers and impedances of first and second pull-up and pull-down transistors are programmed. A control signal may be used to turn on or off parallel termination.

Other embodiments and features are also disclosed.

BRIEF DESCRIPTION OF THE DRAWINGS

FIGS. 2A through 2D are schematic diagrams showing exemplary circuits for programmable variable-impedance in accordance with an embodiment of the invention.

DETAILED DESCRIPTION

The present disclosure provides a programmable output buffer which is advantageously configurable to either provide parallel termination for differential signaling or drive single-ended signals with the parallel termination turned off. In the differential signaling mode, the buffer circuit provides parallel termination to advantageously reduce the output impedance without increasing the output current and voltage swing. The differential signaling mode is useful for LVDS. In the single-ended signaling mode, the buffer circuit provides additional driving strength for driving the single-ended signals.

Figure 1:
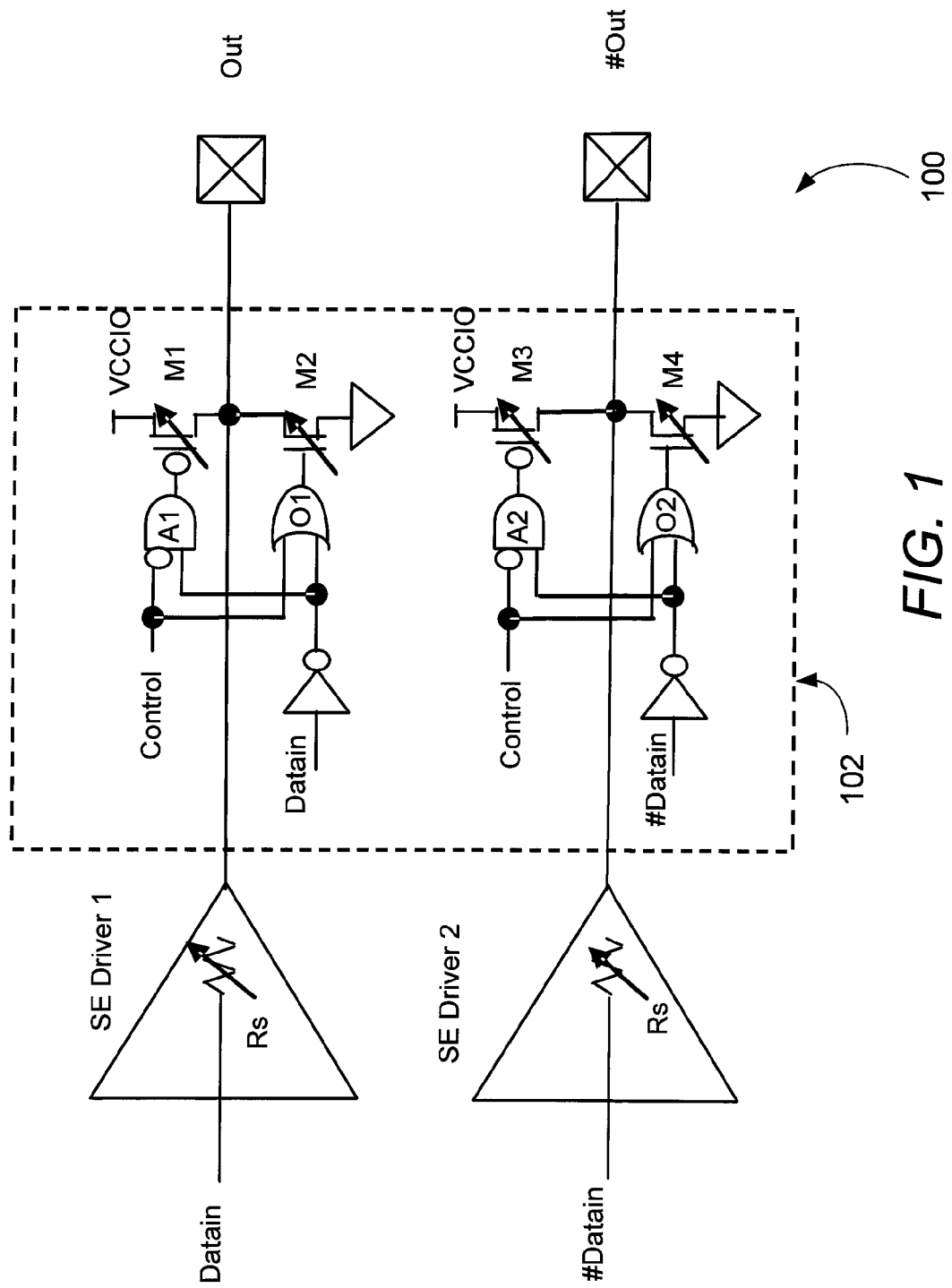
FIG. 1 is a schematic diagram of an exemplary programmable output buffer in accordance with an embodiment of the invention.

FIG. 1 is a schematic diagram of an exemplary programmable output buffer 100 in accordance with an embodiment of the invention. As described further below, the programmable output buffer 100 may be programmed or electronically configured to operate as either two single-ended output buffers or a single differential output buffer. As shown, the programmable output buffer 100 may include two single-ended driver circuits (SE Driver 1 and SE Driver 2) and programmable on-chip termination circuitry 102.

SE Driver 1 is arranged to receive a first data input signal (Datain), and SE Driver 2 is arranged to receive a second data input signal (#Datain). When the programmable output buffer 100 is configured to operate as two single-ended buffers, then Datain and #Datain may be two independent data signals. On the other hand, when the programmable output buffer 100 is configured to operate as a single differential output buffer, then Datain and #Datain together constitute a single differential input signal.

Note that Rs represents the output impedance of SE driver 1 and SE driver 2, not a physical resistor. The output of SE Driver 1 drives a first output pin (Out), and the output of SE Driver 2 drives a second output pin (#Out).

In accordance with an embodiment of the invention, programmable on-chip termination circuitry 102 is connected to the output nodes (Nodes 1 and 2). As shown, the programmable on-chip termination circuitry 102 may include two AND logic circuits (A1 and A2), two OR logic circuits (O1 and O2), and four programmable variable-impedance transistor circuits (M1, M2, M3 and M4).

In a first operating mode, the programmable variable-impedance transistor circuits M1 M2, M3 and M4 may be used for differential output termination. In a second operating mode, the programmable variable-impedance transistor circuits M1, M2, M3 and M4 may be used as part of single-ended buffers for single-ended output.

Consider the first operating mode which may be used for differential termination. This mode may be enabled by setting the Control signal to high (logical 1). Because the Control signal is inverted prior to input into the AND logic gates (A1 and A2), when the Control signal is high, then one of the inputs into each of A1 and A2 is low. As such, the outputs of A1 and A2 are low in this mode. Since the gates of M1 and M3 are controlled by the inverted outputs of A1 and A2, both M1 and M3 are turned on in this mode. In addition, when the Control signal is high, one of the inputs into the OR logic gates (O1 and O2) is high. As such, the outputs of O1 and O2 are high in this mode. Since the gates of M2 and M4 are controlled by the inverted outputs of O1 and O2, both M2 and M4 are turned on in this mode. Hence, when Control is high, M1 through M4 are turned on.

In this mode, pull-up transistor circuit M1 and pull-down transistor circuit M2 provide parallel termination for pin Out, and pull-up transistor circuit M3 and pull-down transistor circuit M4 provide parallel termination for pin #Out. In this mode, the impedance of the parallel termination Rt for pin Out is equal to the impedance of M1 in parallel with the impedance of M2. The ratio of the impedance of M1 and the impedance of M2 determines the voltage to which the pin Out is terminated. If the impedances of M1 and M2 are the same, then the pin Out is terminated to one-half VCCIO.

Similarly, pull-up transistor circuit M3 and pull-down transistor circuit M4 provide parallel termination for pin #Out, and pull-up transistor circuit M3 and pull-down transistor circuit M4 provide parallel termination for pin #Out. In this mode, the impedance of the parallel termination #Rt for pin #Out is equal to the impedance of M3 in parallel with the impedance of M4. The ratio of the impedance of M3 and the impedance of M4 determines the voltage to which the pin #Out is terminated. If the impedances of M3 and M4 are the same, then the pin #Out is terminated to one-half VCCIO.

In the first operating mode, the total differential output impedance may be given by two times Rs in parallel with (Rt 1+Rt 2), where Rs is the programmable output impedance for the single-ended drivers (SE Drivers 1 and 2), and Rt 1 and Rt 2 are the impedances of the pull-up and pull-down termination transistors, respectively, in parallel with SE driver 1 and SE driver 2. In other words, Rt 1 is the parallel termination impedance of pin Out, and Rt 2 is the parallel termination impedance of pin #Out. To minimize the signal reflection and achieve optimal performance, the output impedance for the differential signal driver per the first operating mode may be set to match the printed circuit board (PCB) trace impedance. However, the parallel termination consumes power, so there is a tradeoff between power consumption and performance. By programming the impedances Rs, Rt 1 and Rt 2, an appropriate output impedance may be selected for a particular application.

Now consider the second operating mode which may be used for two single-ended outputs. This mode may be enabled by setting the Control signal to low (logical 0). Because the Control signal is inverted prior to input into the AND logic gates (A1 and A2), when the Control signal is low, then one of the inputs into each of A1 and A2 is high. As such, the outputs of A1 and A2 are dependent on (follow) the inverted versions of the Datain and #Datain signals, respectively. In addition, when the Control signal is low, one of the inputs into the OR logic gates (O1 and O2) is low. As such, the outputs of O1 and O2 are also dependent on (i.e. follow) the inverted versions of the Datain and #Datain signals, respectively.

In this mode, when Datain is high, then the inverted output of A1 is high, so M1 is turned on, while the output of O1 is low, so M2 is turned off. On the other hand, when Datain is low, then the inverted output of A1 is low, so M1 is turned off, while the output of O1 is high, so M2 is turned on. Hence, in this imode, when Datain is high, then Out is driven high, and when Datain is low, then Out is driven low. Similarly, when #Datain is high, then the inverted output of A2 is high, so M3 is turned on, while the output of O2 is low, so M4 is turned off. On the other hand, when #Datain is low, then the inverted output of A2 is low, so M3 is turned off, while the output of O2 is high, so M4 is turned on. Hence, in this mode, when #Datain is high, then #Out is driven high, and when #Datain is low, then #Out is driven low. In other words, in this mode, the circuitry 102 provides more driving capability to SE Driver 1 and SE Driver 2.

Figure 2C:
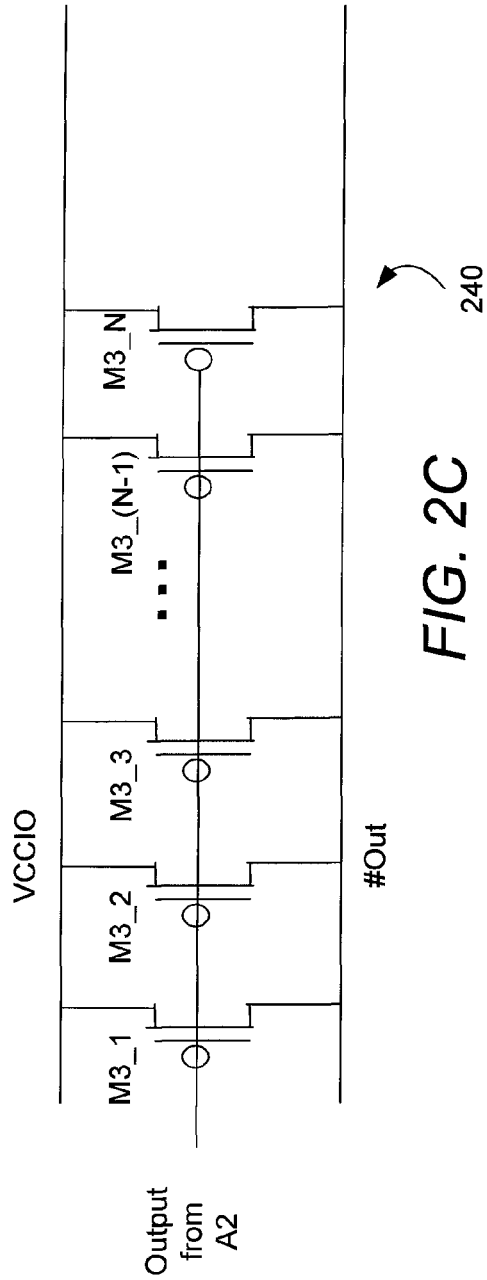
Figure 2D:
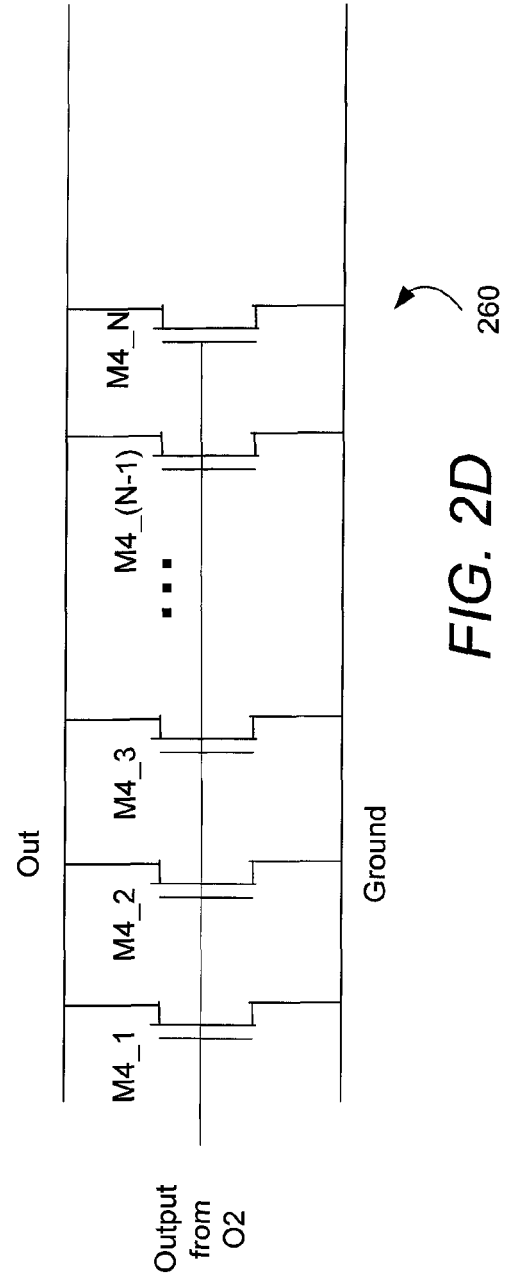

FIGS. 2A through 2D are schematic diagrams showing exemplary circuits for the programmable variable-impedance transistors in accordance with an exemplary embodiment of the invention. FIG. 2A depicts an exemplary circuit 200 for the programmable variable-impedance transistor M1. FIG. 2B depicts an exemplary circuit 220 for the programmable variable-impedance transistor M2. FIG. 2C depicts an exemplary circuit 240 for the programmable variable-impedance transistor M3. Finally, FIG. 2D depicts an exemplary circuit 260 for the programmable variable-impedance transistor M4.

As shown in FIG. 2A, the programmable variable-impedance transistor M1 may be formed using N programmable transistors M1_1, M1_2, M1_3, ..., M1_(N−1), and M1_N which are arranged in parallel between the voltage source VCCIO and the output pin (Out). Each of the programmable on/off transistors M1_1, M1_2, M1_3, ..., M1_(N−1), and M1_N may be programmed (configured) to be either enabled or disabled. The impedance of M1 may be lowered by configuring more of the programmable transistors to be enabled and may be raised by configuring less of the on/off transistors to be disabled. Each of the enabled transistors is controlled by the inverted output from the A1 logic gate.

Similarly, as shown in FIG. 2B, the programmable variable-impedance transistor M2 may be formed using N programmable transistors M2_1, M2_2, M2_3, ..., M2_(N−1), and M2_N which are arranged in parallel between the output pin (Out) and a circuit ground. Each of the programmable on/off transistors M2_1, M2_2, M2_3, ..., M2_(N−1), and M2_N may be programmed to be either enabled or disabled. The impedance of M2 may be lowered by configuring more of the programmable transistors to be enabled and may be raised by configuring less of the on/off transistors to be disabled. Each of the enabled transistors is controlled by the output from the O1 logic gate.

Also similarly, as shown in FIG. 2C, the programmable variable-impedance transistor M3 may be formed using N programmable transistors M3_1, M3_2, M3_3, ..., M3_(N−1), and M3_N which are arranged in parallel between the voltage source VCCIO and the output pin (Out). Each of the programmable on/off transistors M3_1, M3_2, M3_3, ..., M3_(N−1), and M3_N may be programmed to be either enabled or disabled. The impedance of M3 may be lowered by configuring more of the programmable transistors to be enabled and may be raised by configuring less of the on/off transistors to be disabled. Each of the enabled transistors is controlled by the inverted output from the A2 logic gate.

Finally, as shown in FIG. 2D, the programmable variable-impedance transistor M4 may be formed using N programmable transistors M4_1, M4_2, M4_3, ..., M4_(N−1), and M4_N which are arranged in parallel between the output pin (Out) and the circuit ground. Each of the programmable on/off transistors M4_1, M4_2, M4_3, ..., M4_(N−1), and M4_N may be programmed to be either enabled or disabled. The impedance of M4 may be lowered by configuring more of the programmable transistors to be enabled and may be raised by configuring less of the on/off transistors to be disabled. Each of the enabled transistors is controlled by the output from the O2 logic gate.

Thus, as described in detail above, when the two pins Out and #Out are configured to be used for differential signal output, then the parallel output termination is turned on by setting the Control to be high. On the other hand, when the two pins Out and #Out are configured to be single-ended input/output pins, then the parallel output termination is turned off by resetting the Control to be low.

Figure 3:
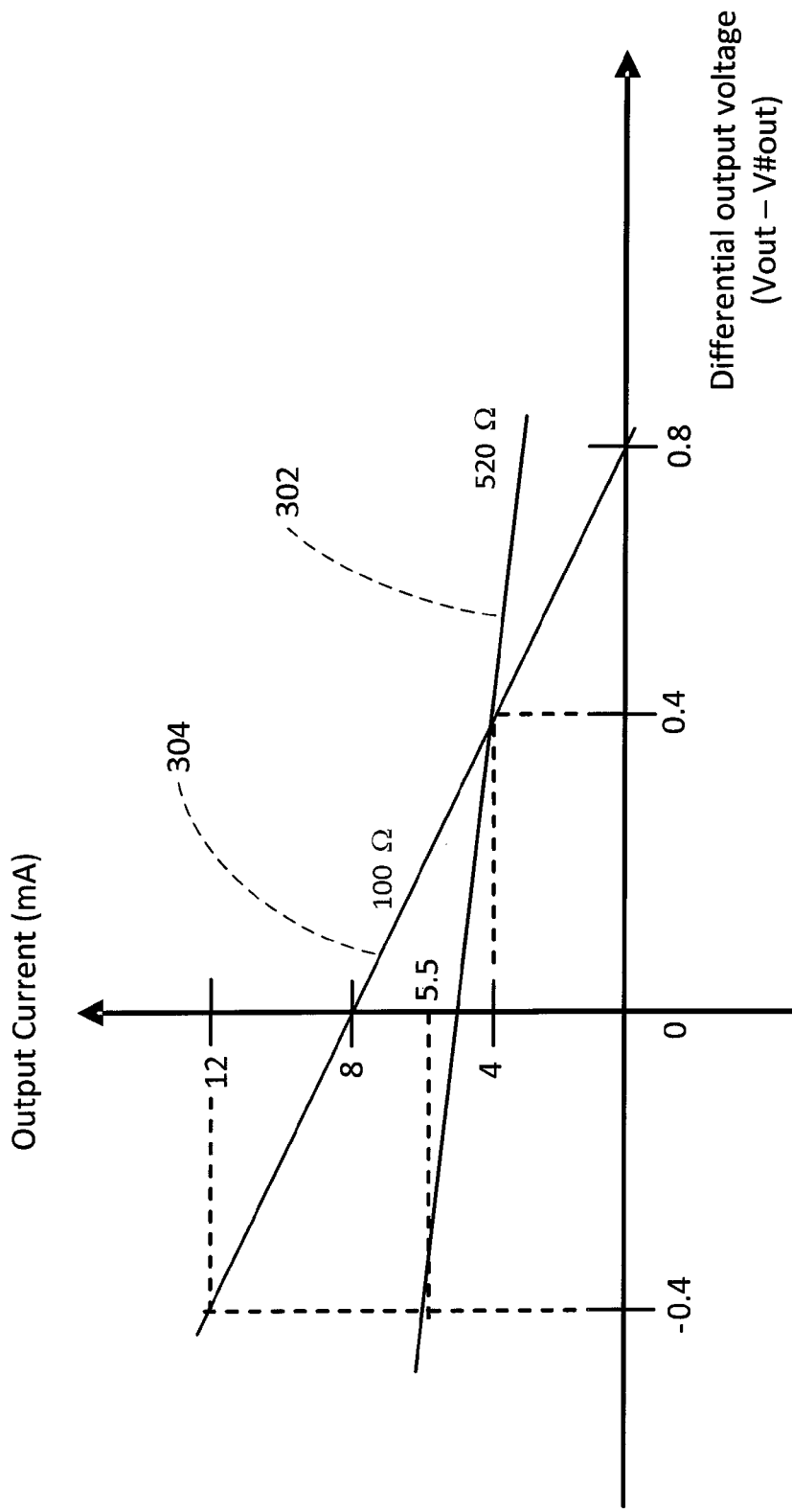
FIG. 3 is an exemplary graph showing output current as a function of differential output voltage with and without parallel termination in accordance with an embodiment of the invention

FIG. 3 is an exemplary graph of output current (in mill amperes or mA) as a function of differential output voltage (in volts) with and without parallel termination in accordance with an embodiment of the invention. A first line 302 shows the output impedance Zout of the differential driver is approximately 520 ohms without parallel termination. A second line 304 shows the output impedance Zout of the differential driver is reduced to approximately 100 ohms with parallel termination.

In an exemplary embodiment, the peak output current during switching may be given by I=4 mA+ΔI=4 mA+ΔV/Zout. In this embodiment, the voltage may switch between +0.4 V and −0.4 V such that ΔV=0.8 V. In this case, without parallel termination, Zout=520Ω, so the peak output current during switching may be given by I=4 mA+0.8V/520 Ω=5.5 mA. On the other hand, with parallel termination, Zout=100Ω, so the peak output current during switching may be increased to I=4 mA+0.8 V/100 Ω=12 mA.

Figure 4:
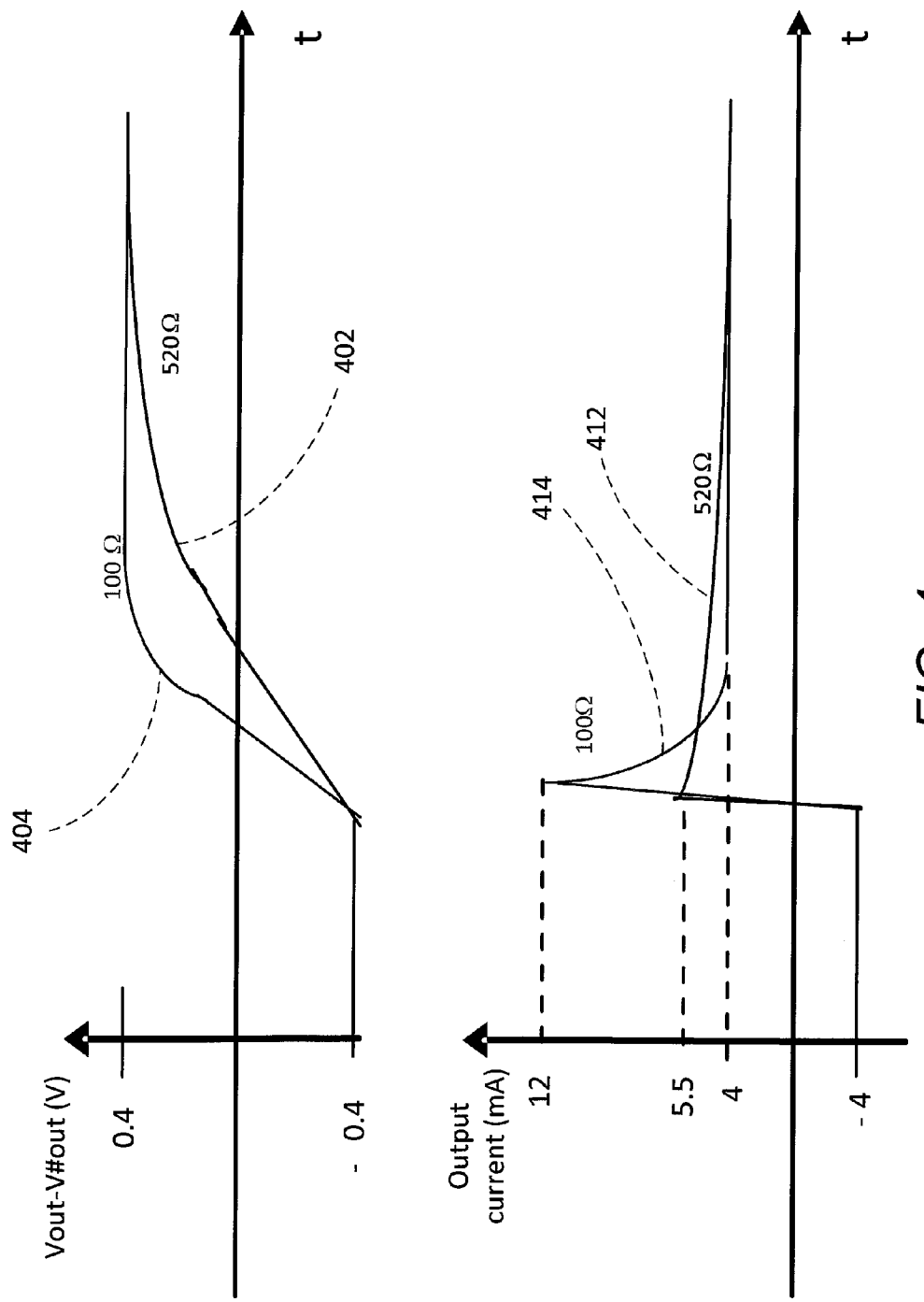
FIG. 4 depicts exemplary graphs of the differential output voltage and the peak output current during switching in accordance with an embodiment of the invention.

FIG. 4 shows exemplary graphs of the differential output voltage and the peak output current during switching in accordance with an embodiment of the invention. The top graph gives the differential output voltage (Vout−#Vout) in volts (V) as a function of time, while the bottom graph is a corresponding plot showing output current in milli amperes (mA) as a function of time. As seen in the top graph, the differential output voltage has a substantially slower switching speed without parallel termination (plot 402) than with parallel termination (plot 404). As seen in the bottom graph, the output current peaks at 5.5 mA without parallel termination (plot 412) and at 12 mA with parallel termination (plot 414).

Figure 5:
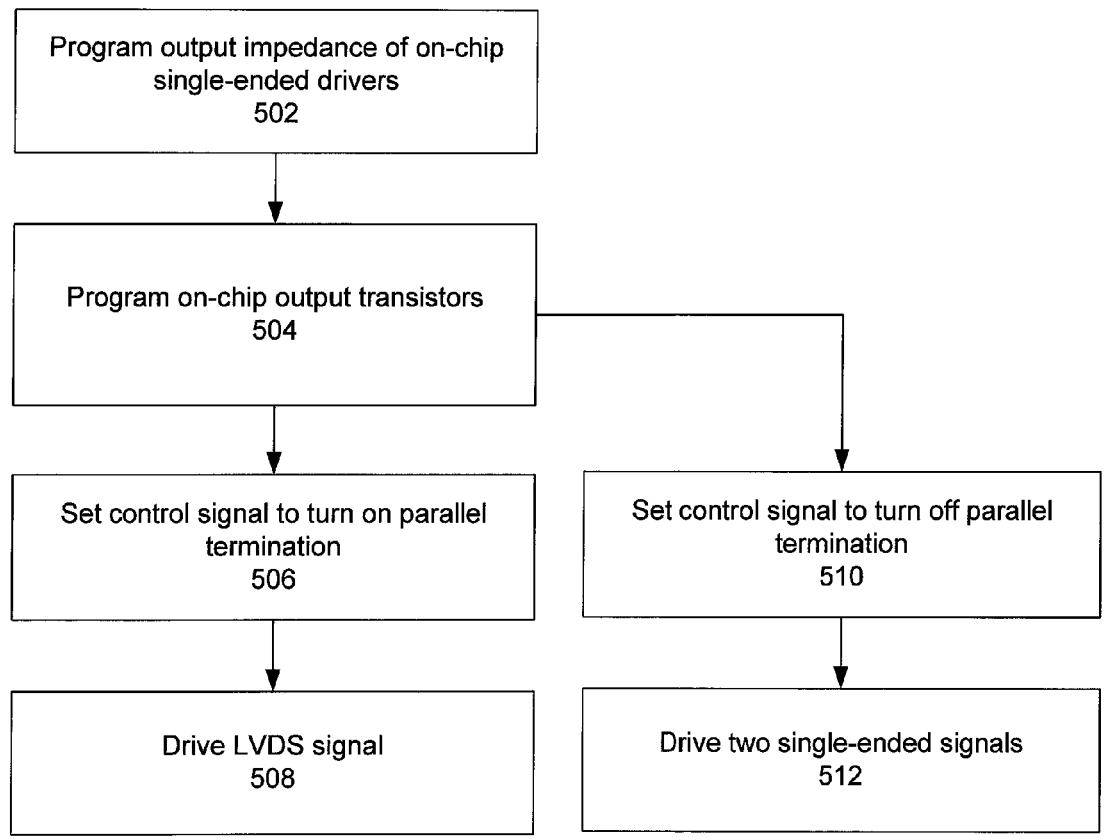
FIG. 5 is a flow chart depicting an exemplary method of using a differential output buffer in accordance with an embodiment of the invention.

FIG. 5 is a flow chart depicting an exemplary method 500 of using a differential output buffer in accordance with an embodiment of the invention. Per block 502, the output impedance of the on-chip single-ended drivers (SE Drivers 1 and 2) may be programmed (i.e. electronically configured). In addition, per block 504, the on-chip output transistor circuits (M1 through M4) may be programmed (i.e. electronically configured).

In one configuration, the control signal (Control) may be set 506 (for example, during the programming of the chip) to turn on the parallel termination. In this configuration, a differential signal may be driven 508 using the two drivers with the output transistor circuits providing parallel termination.

In another configuration, the control signal (Control) may be reset 510 (for example, during the programming of the chip) to turn off the parallel termination. In this configuration, two independent single-ended signals may be driven 512 using the two single-ended drivers with the output transistor circuits providing additional driving capability to the single-ended driver circuits.

Note that the programming steps may be performed in any order. For example, either steps 502, 504 and 506, or steps 502, 504 and 510, may be performed in any order during programming.

In an exemplary implementation, the differential output may comprise a LVDS signal. For example, the LVDS signal may have a differential output of 400 mV (VOD) at 1.25 V common mode voltage (VOS) and may have an output current of 4 mA. In this case, the differential voltage swing would be between 1.05 V (VOL) and 1.45 V (VOH).

Further in this implementation, without parallel termination, the single-ended driver should give about 4 mA output current at 1.45 V output voltage while driving up, and sink about 4 mA at 1.05V while driving down. This translates to a single-ended output impedance of about 260 ohms, or 520 ohms for the differential output impedance. As described above, the differential output impedance may be advantageously reduced using the programmable output buffer disclosed herein.

Unlike conventional off-chip solutions, no external resistors are needed. This saves space and reduces complexity of the printed circuit board. Unlike conventional on-chip solutions, the on-chip programmable output buffer disclosed herein allows programmable sharing of the output transistors between the single-ended driver and output parallel termination. This not only provides parallel termination with little extra die size but also without extra pin capacitance. The presently-disclosed solution effectively uses un-used driving capability of the single-ended output driver for use in parallel output termination.

Figure 6:
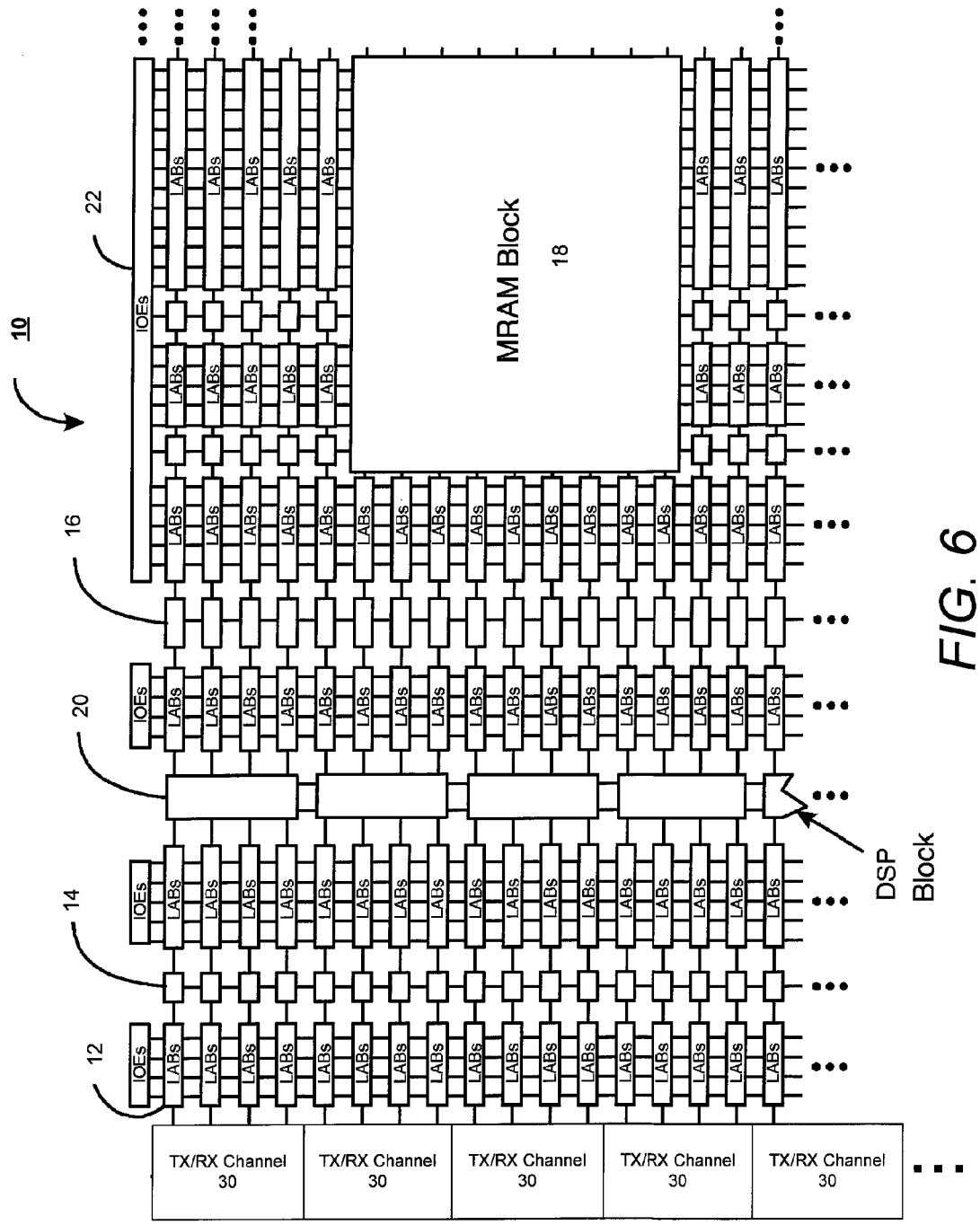
FIG. 6 is a simplified partial block diagram of a field programmable gate array (FPGA) that may include aspects of the present invention.

FIG. 6 is a simplified partial block diagram of a field programmable gate array (FPGA) 10 that may include aspects of the present invention. It is to be understood that FPGA 10 is described herein for illustrative purposes only and that the present invention can be implemented in many different types of integrated circuits, such as programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed.

LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each 10E 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, a transmitter having a programmable output buffer as disclosed herein.

Figure 7:
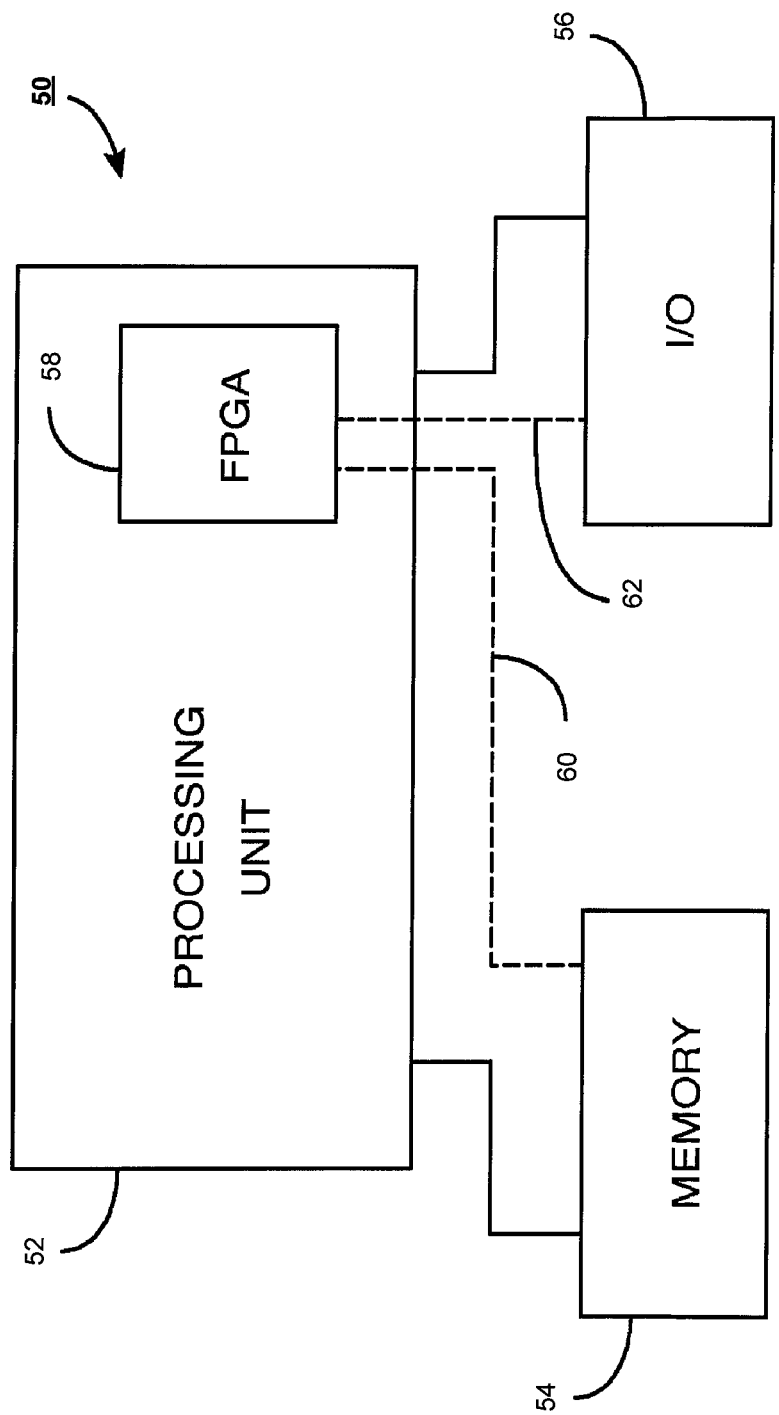
FIG. 7 is a block diagram of an exemplary digital system that may employ techniques of the present invention.

The present invention can also be implemented in a system that has a FPGA as one of several components. FIG. 7 shows a block diagram of an exemplary digital system 50 that may employ techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A programmable output buffer comprising:
   a first programmable variable-impedance single-ended driver circuit arranged to receive a first data input signal and output a first data output signal on a first output pin;
   a second programmable variable-impedance single-ended driver circuit arranged to receive a second data input signal and output a second data output signal on a second output pin;
   programmable on-chip termination circuitry comprising a first termination circuit coupled to the first output pin and a second termination circuit coupled to the second output pin, wherein the first and second termination circuits are programmable to either implement parallel termination or as part of the single-ended output buffers to provide additional driving capability, wherein the first termination circuit comprises a first programmable variable-impedance pull-up transistor circuit and a first programmable variable-impedance pull-down transistor circuit, and wherein the second termination circuit comprises a second programmable variable-impedance pull-up transistor circuit and a second programmable variable-impedance pull-down transistor circuit in the second termination circuit;
   a first plurality of programmable transistors in the first programmable variable-impedance pull-up transistor circuit, wherein the first plurality of programmable transistors are arranged in parallel between the voltage source and the first output pin;
   a second plurality of programmable transistors in the first programmable variable-impedance pull-down transistor circuit, wherein the second plurality of programmable transistors are arranged in parallel between the first output pin and the circuit ground;
   a third plurality of programmable transistors in the second programmable variable-impedance pull-up transistor circuit, wherein the third plurality of programmable transistors are arranged in parallel between the voltage source and the second output pin;
   a fourth plurality of programmable transistors in the second programmable variable-impedance pull-down transistor circuit, wherein the fourth plurality of programmable transistors are arranged in parallel between the second output pin and the circuit ground;
   a first logic circuit which has inputs arranged to receive an inverted version of the first data input signal and a control signal and has an output coupled to control gates of the first plurality of programmable transistors;
   a second logic circuit which has inputs arranged to receive the inverted version of the first data input signal and the control signal and has an output coupled to control gates of the second plurality of programmable transistors;
   a third logic circuit which has inputs arranged to receive an inverted version of the second data input signal and the control signal and has an output coupled to control gates of the third plurality of programmable transistors; and
   a fourth logic circuit which has inputs arranged to receive the inverted version of the second data input signal and the control signal and has an output coupled to control gates of the fourth plurality of programmable transistors.

2. The programmable output buffer of claim 1,
   wherein the first logic circuit performs an AND logic operation on the inverted version of the first data input signal and an inverted version of the control signal;
   wherein the second logic circuit performs an OR logic operation on the control signal and the inverted version of the first data input signal,
   wherein the third logic circuit performs an AND logic operation on the inverted version of the second data input signal and an inverted version of the control signal; and
   wherein the fourth logic circuit performs an OR logic operation on the control signal and the inverted version of the second data input signal.

3. The programmable output buffer of claim 1, wherein, in a first operating mode in which the programmable output buffer is configured for parallel termination of the first and second output pins, each of the first and second programmable variable-impedance pull-up transistor circuits and the first and second programmable variable-impedance pull-down transistor circuits are turned on.

4. The programmable output buffer of claim 3, wherein, in a second operating mode in which the programmable output buffer is configured for single-ended driving of the first and second output pins, the first programmable variable-impedance pull-up transistor circuit is turned off when the first data input signal is low and turned on when the first data input signal is high, the first programmable variable-impedance pull-down transistor circuit is turned off when the first data input signal is high and turned on when the first data input signal is low, the second programmable variable-impedance pull-up transistor circuit is turned off when the second data input signal is low and turned on when the second data input signal is high, and the second programmable variable-impedance pull-down transistor circuit is turned off when the second data input signal is high and turned on when the second data input signal is low.

5. An integrated circuit comprising:
a first data output pin;
a second data output pin;
a first variable-impedance single-ended driver circuit arranged to receive a first data input signal and output a first data output signal on the first output pin;
a second variable-impedance single-ended driver circuit arranged to receive a second data input signal and output a second data output signal on the second output pin;
a first variable-impedance pull-up transistor circuit which is arranged to interconnect a voltage source to the first output pin;
a first variable-impedance pull-down transistor circuit which is arranged to interconnect a circuit ground to the first output pin;
a second variable-impedance pull-up transistor circuit which is arranged to interconnect the voltage source to the second output pin;
a second variable-impedance pull-down transistor circuit which is arranged to interconnect the circuit ground to the second output pin;
a first plurality of transistor devices in the first variable-impedance pull-up transistor circuit, wherein the first plurality of transistor devices are arranged in parallel between the voltage source and the first output pin;
a second plurality of transistor devices in the first variable-impedance pull-down transistor circuit, wherein the second plurality of transistor devices are arranged in parallel between the first output pin and the circuit ground;
a third plurality of transistor devices in the second variable-impedance pull-up transistor circuit, wherein the third plurality of transistor devices are arranged in parallel between the voltage source and the second output pin;
a fourth plurality of transistor devices in the second variable-impedance pull-down transistor circuit, wherein the fourth plurality of transistor devices are arranged in parallel between the second output pin and the circuit ground;
a first logic circuit which has inputs arranged to receive an inverted version of the first data input signal and a control signal and has an output coupled to control gates of the first plurality of transistor devices;
a second logic circuit which has inputs arranged to receive the inverted version of the first data input signal and the control signal and has an output coupled to control gates of the second plurality of transistor devices;
a third logic circuit which has inputs arranged to receive an inverted version of the second data input signal and the control signal and has an output coupled to control gates of the third plurality of transistor devices; and
a fourth logic circuit which has inputs arranged to receive the inverted version of the second data input signal and the control signal and has an output coupled to control gates of the fourth plurality of transistor devices.

6. The integrated circuit of claim 5,
wherein the first logic circuit performs an AND logic operation on the inverted version of the first data input signal and an inverted version of the control signal;
wherein the second logic circuit performs an OR logic operation on the control signal and the inverted version of the first data input signal,
wherein the third logic circuit performs an AND logic operation on the inverted version of the second data input signal and an inverted version of the control signal; and
wherein the fourth logic circuit performs an OR logic operation on the control signal and the inverted version of the second data input signal.

7. The integrated circuit of claim 5, wherein, in a first operating mode in which the integrated circuit is configured for parallel termination of the first and second output pins, each of the first and second variable-impedance pull-up transistor circuits and the first and second variable-impedance pull-down transistor circuits are turned on.

8. The integrated circuit of claim 7, wherein, in a second operating mode in which the integrated circuit is configured for single-ended driving of the first and second output pins, the first variable-impedance pull-up transistor circuit is turned on when the first data input signal is high and turned off when the first data input signal is low, the first variable-impedance pull-down transistor circuit is turned on when the first data input signal is low and turned off when the first data input signal is high, the second variable-impedance pull-up transistor circuit is turned on when the second data input signal is high and turned off when the second data input signal is low, and the second variable-impedance pull-down transistor circuit is turned on when the second data input signal is low and turned off when the second data input signal is high.

* * * * *